(12) United States Patent
Asano et al.

(10) Patent No.: US 6,777,277 B2
(45) Date of Patent: Aug. 17, 2004

(54) MANUFACTURING METHOD OF SCHOTTKY BARRIER DIODE

(75) Inventors: Tetsuro Asano, Gunma (JP); Katsuaki Onoda, Gunma (JP); Yoshibumi Nakajima, Tochigi (JP); Shigeyuki Murai, Gunma (JP); Hisaaki Tominaga, Gunma (JP); Koichi Hirata, Tochigi (JP); Mikito Sakakibara, Saitama (JP); Hidetoshi Ishihara, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 168 days.

(21) Appl. No.: 10/205,605

(22) Filed: Jul. 26, 2002

(65) Prior Publication Data

US 2003/0060031 A1 Mar. 27, 2003

(30) Foreign Application Priority Data

Sep. 25, 2001 (JP) .................................. 2001-290756

(51) Int. Cl.$^7$ ............................................. H01L 21/338
(52) U.S. Cl. ...................... 438/167; 438/572; 438/606
(58) Field of Search ................................ 438/167, 571, 438/572, 573, 602, 604, 606

(56) References Cited

U.S. PATENT DOCUMENTS

| | | | | |
|---|---|---|---|---|
| 5,021,840 A | * | 6/1991 | Morris | 257/476 |
| 5,221,638 A | * | 6/1993 | Ohtsuka et al. | 438/573 |
| 5,278,444 A | * | 1/1994 | Lieneweg et al. | 257/476 |
| 6,096,587 A | * | 8/2000 | Imoto et al. | 438/572 |
| 6,323,518 B1 | | 11/2001 | Sakamoto et al. | 257/330 |

FOREIGN PATENT DOCUMENTS

| | | |
|---|---|---|
| JP | 11-238847 | 8/1999 |
| JP | 2000-91344 | 3/2000 |
| JP | 2000-216244 | 8/2000 |

OTHER PUBLICATIONS

Yasoo Harada et al. "Conversion Loss of Novel Beam–Lead GaAs Schottky–Barrier Diodes: A Comparison between Calculation and Measurement" Research Center, Sanyo Electric Co., Ltd. Oct. 1983, pp. 55–61.
Yasoo Harada "Research on High Reliability Beam Lead GaAs Schottky Diode" (no date).

* cited by examiner

*Primary Examiner*—Chandra Chaudhari
(74) *Attorney, Agent, or Firm*—Morrison & Foerster LLP

(57) ABSTRACT

A Schottky barrier diode has a Schottky contact region formed in an n epitaxial layer disposed on a GaAs substrate and an ohmic electrode surrounding the Schottky contact region. The ohmic electrode is disposed directly on an impurity-implanted region formed on the substrate. An insulating region is formed through the n epitaxial layer so that an anode bonding pad is isolated form other elements of the device at a cathode voltage. The planar configuration of this device does not include the conventional polyimide layer, and thus has a better high frequency characteristics than conventional devices.

18 Claims, 10 Drawing Sheets

MANUFACTURING METHOD OF SCHOTTKY BARRIER DIODE

BACKGROUND OF THE INVENTION

1. Field of the Invention

The invention relates to a manufacturing method of Schottky barrier diode device made of a compound semiconductor and applied in a high frequency circuit, specifically to a manufacturing method of Schottky barrier diode having a planar configuration to achieve a smaller operation region and a smaller overall chip size.

2. Description of the Related Art

The demand for high frequency devices has been rapidly increasing due to the expanding market for portable telephones and digital satellite communication equipment. Many of such devices include field effect transistors (referred to as FET, hereinafter) employing a gallium arsenide (referred to as GaAs, hereinafter) substrate because of its excellent high frequency characteristics. Typical application in this field includes local oscillation FETs for satellite antenna and monolithic microwave integrated circuits (MMIC) in which a plurality of FETs are integrated for wireless broadband. GaAs Schottky barrier diodes are also used in a base station of cellular phone system.

FIG. 1 is a cross-sectional view including an operation region of a conventional Schottky barrier diode. An n+ epitaxial layer 22 (a silicon impurity concentration of about $5 \times 10^{18}$ cm$^{-3}$) having a thickness of about 6 μm is formed on an n+ GaAs substrate 21. An n epitaxial layer 23 (a silicon impurity concentration of about $1.3 \times 10^{17}$ cm$^{-3}$) having a thickness of about 350 nm is formed on the n+ epitaxial layer 22. This n epitaxial layer provides as an operation region.

An ohmic electrode 28 makes a ohmic contact with the n+ epitaxial layer 22 and is made of a AuGe (gold-germanium alloy)/Ni (nickel)/Au (gold) metal layer disposed as a first wiring layer. A Ti (titanium)/Pt (platinum)/Au metal 32 serves as a second wiring layer, and is divided into wiring on the anode side and wiring on the cathode side. On the anode side, the Ti/Pt/Au metal layer makes a Schottky contact with the n epitaxial layer 23, and forms a Schottky contact region 31a. The portion of the Ti/Pt/Au metal layer on the anode side above the Schottky contact region 31a is referred to as a Schottky electrode 31. An anode electrode 34 is formed on and completely overlaps with the Schottky electrode 31 and its extension. The anode electrode 34 provides an anode bonding pad 34a and is formed by Au plating using the Schottky electrode 31 and its extension as a plating electrode. A bonding wire 40 is fixed to the anode bonding pad 34a. The Au metal layer serves as a third wiring layer and has a thickness of about 6 μm. The thick Au layer is necessary for providing stress relief during wire bonding. On the cathode side, the cathode electrode 35 provides a cathode bonding pad and is formed of the Au layer. The Ti/Pt/Au metal layer on the cathode side directly contacts the ohmic electrode 28. The edge of the Schottky electrode 31 needs to be on a top surface of a polyimide layer 30 to satisfy photolithographic requirements. Accordingly, a portion of the Schottky electrode 31, near the Schottky region 31a, overlaps by about 16 μm with the polyimide layer 30 formed on the ohmic electrode 28 on the cathode side. The entire substrate and epitaxial layers are at a cathode voltage except the Schottky contact region 31a. The polyimide layer 30 insulates the anode electrode 34 from the substrate 22 and the epitaxial layers. The intersection between the anode electrode 34 and the underlying structure and the intersection between the anode bonding pad 34a and the underlying structure are, in total, about 3900 μm$^2$, which could provide a large parasitic capacitance to the device if the thickness of the polyimide layer 30 is small. Thus, to have a reasonably small parasitic capacitance, the thickness of the polyimide layer must be as large as 6–7 μm even though the polyimide film 30 has a relatively low dielectric constant.

The n epitaxial layer 23 of the lower impurity concentration ($1.3 \times 10^{17}$ cm$^{-3}$) is necessary for assuring a Schottky contact region 31a with good Schottky characteristics and a high breakdown strength (10V). The ohmic electrode 28 is formed directly on the n+ epitaxial layer 22 for reducing the resistance at the contact. For this reason, a mesa etching process is necessary for exposing the top surface of the n+ epitaxial layer 22. The n+ GaAs substrate 21 underneath the n+ epitaxial layer 22 also has a high impurity concentration, and has a backside electrode made of the AuGe/Ni/Au metal layer for an external contact from the backside.

FIG. 2 is a schematic top view of the conventional Schottky barrier diode having the operation region shown in FIG. 1. The Schottky contact region 31a formed in the n epitaxial layer 23 occupies a central portion of the device. The diameter of this region 31a is about 10 μm. A Schottky contact hole 29 is formed in the center of the Schottky contact region 31a. The Ti/Pt/Au metal layer of the second wiring layer is in direct contact with the n epitaxial layer 23 through the contact hole 29. The ohmic electrode 28 of the first wiring layer surrounds the circular Schottky contact region 31a, and occupies almost a half of the top surface of the device.

The Au metal layer of the third wiring layer provides the bonding pads. On the anode side, the anode bonding pad 34a has a minimum area allowed for one bonding wire 40. On the cathode side, the cathode bonding pad 35a is large enough to provide bonding of multiple wires 40, which is required for reducing the inductance generated at bonding wires. The cathode bonding pad 35a and the cathode electrode 35 are formed directly on the ohmic electrode 8 disposed on the n+ epitaxial layer without the intervening polyimide layer 30. The area of the anode bonding pad 34a is about 40×60 μm$^2$ and the area for the cathode bonding pad is about 240×70 μm$^2$.

However, the mesa etching, which is required to expose the n+ epitaxial layer 22 through the n epitaxial layer 23 for the direct contact with the ohmic electrode 28, is not stable enough to provide accurate patterning of the device. For example, the wet etching process used in the mesa etching may remove the oxide film 25 around the contact hole 29, leading to formation of mesa with an irregular shape. Such an irregular mesa structure may cause adverse effects on the Schottky barrier diode, especially the characteristics of the Schottky contact region 31a.

Furthermore, the polyimide layer 30 has a thickness as large as 6–7 μm to reduce the parasitic capacitance generated between the Schottky electrode 31 and the underlying structures (the epitaxial layers 22, 23 and the substrate 21) at the cathode voltage. To form a step coverage of this thick polyimide layer 30 with the electrodes 31, 34, 35, the edges of the polyimide layer 30 near the Schottky contact region 31a must have a tapered cross-section, as shown in FIG. 1. Such a tapered structure gives rise to a variation of the tapering angle, typically between 30 and 45 degrees. To accommodate this variation, a long separation between the Schottky contact region 31a and the ohmic electrode 28 is required. This separation leads to a large resistance and, thus, poor high frequency characteristics. The device shown in FIG. 1 has a separation of about 7 μm.

It should also be noted that the large area (2400 μm$^2$) of the anode bonding pad 34a further contributes to the increase of the parasitic capacitance of the diode device. Furthermore, the polyimide layer 30 and the thick Au layer are made of expensive materials and their use inevitably increases the production cost.

SUMMARY OF THE INVENTION

The invention provides a manufacturing method of Schottky barrier diode including providing a substrate made of a compound semiconductor and epitaxially growing a first layer of a conduction type on the substrate. An insulating region is formed at a predetermined portion of the first layer so that the insulating region reaches the substrate. A metal layer is formed to make a Schottky contact with the first layer and to provide an anode bonding pad.

The invention also provides a manufacturing method of Schottky barrier diode including providing a substrate made of a compound semiconductor and epitaxially growing a first layer of a conduction type on the substrate. An impurity-implanted region of the conduction type is formed at a predetermined portion of the first layer. An insulating region is formed around the impurity-implanted region so that the insulating region reaches the substrate. A metal layer is formed to make a Schottky contact with the first layer and to provide an anode bonding pad.

DETAILED DESCRIPTION OF THE INVENTION

Figure 3:
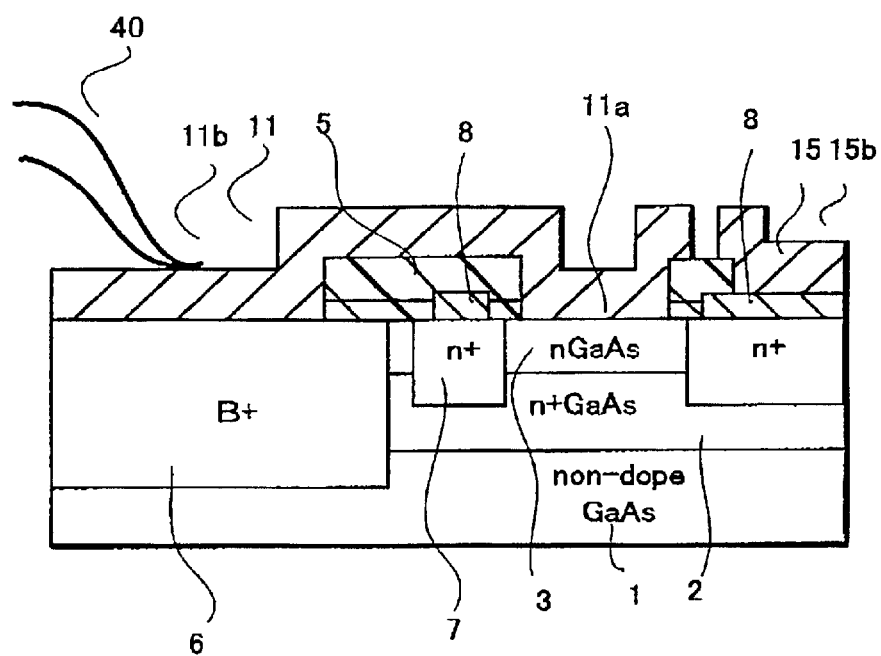
FIG. 3 is a cross-sectional view of a Schottky barrier diode of a first embodiment of this invention.

FIG. 3 is a cross-sectional view of a Schottky barrier diode of a first embodiment of this invention. Specifically, FIG. 3 focuses on an operation region of the first embodiment. The compound semiconductor substrate 1 of this embodiment is an undoped GaAs substrate. An n+ epitaxial layer 2 having a thickness of about 500 nm and a silicon impurity concentration of about $5 \times 10^{18}$ cm$^{-3}$ is formed on the substrate 1. An n epitaxial layer 3 having a thickness of about 250 nm and a silicon impurity concentration of about $1.3 \times 10^{17}$ cm$^{-3}$ is formed on the n+ epitaxial layer 2. The n+ epitaxial layer 2 is much thinner than the n+ epitaxial layer 22 of the conventional device of FIG. 1 so that an insulating region 6 easily reaches the substrate 1 in an impurity injection process as described later. As shown in FIG. 3, the device of the first embodiment has a planar configuration without any mesa structure.

An impurity-implanted region 7 is formed underneath the ohmic electrode 8, and penetrates through the n epitaxial layer 3 to reach the n+ epitaxial layer 2. The impurity-implanted region 7 surrounds a circular Schottky contact region 11a, which is a part of the n epitaxial layer 3, and completely overlaps with an ohmic electrode 8. In the area near the Schottky contact region 11a, the impurity-implanted region 7 slightly extends beyond the ohmic electrode 8 and toward the Schottky contact region 11a. In this configuration, the separation between the Schottky contact region 11a and the impurity-implanted region 7 is 1 μm. The impurity-implanted region 7, which reaches from the ohmic electrode 8 to the n+ epitaxial layer 2 through the n epitaxial layer 3, replaces the mesa structure of conventional device and, thus achieves a planar device structure.

A nitride film 5 insulates an anode electrode 11 from the ohmic electrode 8, the n+ epitaxial layer 2 and the n epitaxial layer 3, which are at a cathode voltage.

Figure 4:
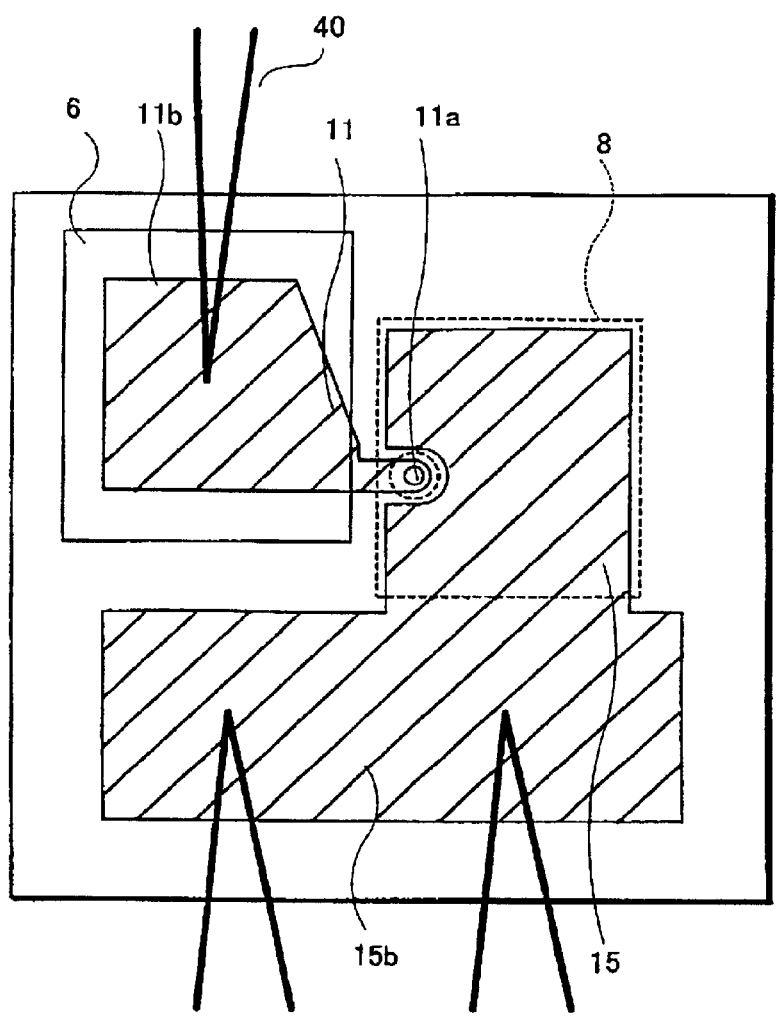
FIG. 4 is a schematic top view of the device of the first embodiment.

The ohmic electrode 8 disposed on the impurity-implanted region 7 is a part of a first wiring layer made of a AuGe/Ni/Au metal layer. The first wiring layer is formed by depositing AuGe, Ni and Au films in this order. The ohmic electrode 8 has a rectangular shape with a hole corresponding to the Schottky contact region 11a (FIG. 4). The separation between the Schottky contact region 11a and the ohmic electrode 8 is about 2 μm.

The portion of the anode electrode 11 above the Schottky contact region 11a makes a Schottky contact with the n epitaxial layer 3 through a Schottky contact hole formed in the nitride film 5 covering the surface of the n epitaxial layer 3. The Schottky contact region 11a has a diameter of about 10 μm, and provides an operation region of the Schottky barrier diode. The thickness of the n epitaxial layer 3 (250 nm) is determined to assure a proper breakdown voltage.

An insulating region 6 is formed underneath an anode bonding pad 11b by implanting boron ions into the epitaxial layers 2, 3 and the substrate 1. The insulating region 6, which penetrates into the substrate 1, prevents the anode bonding pad 11b, which is at an anode voltage, from electrically contacting the epitaxial layers 2, 3, which are at the cathode voltage. Accordingly, the anode bonding pad 11b is disposed directly on the insulating region 6 without any polyimide layer or nitride film, and is free from high frequency signal leakage. For this configuration to be effective, the insulating region 6 should at least reach the insulating substrate 1.

The cathode electrode 15 is formed of a second wiring layer made of a Ti/Pt/Au metal layer and is in contact with the ohmic electrode 8. One end of the cathode electrode 15 faces the anode electrode 11, and other end extends to a cathode bonding pad 15b, which is formed as a part of the second wiring layer. In other words, the cathode electrode 15 provides wiring between the ohmic electrode 8 and the cathode bonding pad 15a. The cathode bonding pad 15a is disposed directly on the n epitaxial layer 3. Accordingly, the impurity-implanted region 7, which is in contact with the ohmic electrode 8, and the n+ epitaxial layer 2 are at the cathode voltage.

The anode electrode 11 is formed of the second wiring layer made of a Ti/Pt/Au metal layer and provides wiring between the Schottky contact region 11a and the anode bonding pad 11b. One end of the anode electrode 11 is in contact with the Schottky contact region 11a, and other end extends to the anode bonding pad 11b, which is formed as a part of the second wiring layer. In other words, the cathode electrode 15 provides wiring between the ohmic electrode 8 and the cathode bonding pad 15a. The cathode bonding pad 15a is disposed directly on the n epitaxial layer 3. The anode bonding pad 11b is insulated from the n epitaxial layer 3 and the n+ epitaxial layer 2, which are at the cathode voltage, by the insulating region 6. Accordingly, high frequency signal leakage at the anode bonding pad 11b can be prevented. Furthermore, because there is no structure contributing to capacitance formation underneath the anode bonding pad 11b, the overall parasitic capacitance of the Schottky barrier diode of this embodiment is reduced.

Two bonding wires 40 are fixed to the anode bonding pad 11b. Four bonding wires 40 are fixed to the cathode bonding pad 15b. A stitch bonding process is applied to the fixation of the bonding wires 40 to the corresponding bonding pads 11b, 15b because the stitch bonding can fix two wires on the bonding pad in one bonding procedure, and, thus, reduce the required area for the bonding.

FIG. 4 is a schematic top view of the Schottky barrier diode of the first embodiment. The Schottky contact region 11a is located approximately in the center of the GaAs chip. The insulating region 6 is larger than the anode bonding pad 11b, which is formed on the insulating region 6.

The area denoted by the broken line is the ohmic electrode 8. The impurity-implanted region 7 (omitted form FIG. 4) is formed underneath the ohmic electrode 8 and covers approximately the same area of the substrate as the ohmic electrode 8. The Schottky contact region 11a is located in the hole created in the ohmic electrode 8. The cathode electrode 15 made of the second wiring layer is disposed on the ohmic electrode 8 to serve as wiring leading to the cathode bonding pad 15a. The external connection of the cathode electrode 15 has a significant influence on the high frequency characteristics, including inductance, of the Schottky barrier diode. In this embodiment, the size of the cathode bonding pad 15a is large enough to provide multiple wire for reducing the inductance. The area of the anode bonding pad 14a is about 60×70 μm, and the area of the cathode bonding pad 15a is about 180×70 μm.

The intersection between the anode electrode 11 and the n epitaxial layer 3, which is at the cathode voltage, is about 100 μm$^2$, which is about one thirty ninth of the intersection area of conventional device (3900 μm$^2$). Because of this reduction, the polyimide layer of conventional device can be replaced by a much thinner nitride film 5.

Due to this planar configuration without any mesa and polyimide layer, there is no need for accommodating dimensional variation arising from processing inaccuracy. Accordingly, the separation between the Schottky contact region 11a and the ohmic electrode 8 is reduced to about 2 μm, and the separation between the Schottky contact region 11a and the impurity-implanted region 7 is reduced to about 1 μm, in comparison to the conventional device, which has a separation of about 7 μm. Because the impurity-implanted region is similar to the ohmic electrode 8 in terms of carrier conduction, the device of this embodiment has a separation of about one seventh of the conventional device. This leads to an improvement of high frequency characteristics over the conventional device since a shorter separation provides a smaller resistance.

Furthermore, with the planar configuration, the chip size reduces from 0.27×0.31 mm$^2$ of the conventional device to 0.25×0.25 mm$^2$ of this embodiment. Notably, the size of the operation region, or the Schottky contact region 11a, is smaller than that of the conventional device by about one tenth.

The insulting region 6 is not completely electrically insulating. Thus, it may be possible that a depletion layer is formed underneath the anode bonding pad 11b, which is made of the second wiring layer, and that the depletion layer reaches the ohmic electrode 8 depending on the high frequency signals the anode bonding pad 11b receives. If this happens, significant high frequency signal leakage results. However, in this embodiment, the depletion layer is prevented from reaching the ohmic electrode 8 by the impurity-implanted region 7 and n+ epitaxial layer 2, both of which are capable of absorbing the depletion layer. Accordingly, the anode-cathode interference is eliminated and the two electrodes are completely separated in terms of high frequency signals.

Furthermore, the anode electrode 11 is formed by evaporating a Ti film, a Pt film and a Au film in this order. Such a thin anode electrode 11 is applicable in this embodiment because the thick polyimide layer of the conventional diode device is replaced by the thin nitride film 5. There is no need for forming a thick Au electrode for stress relief.

Figure 5:
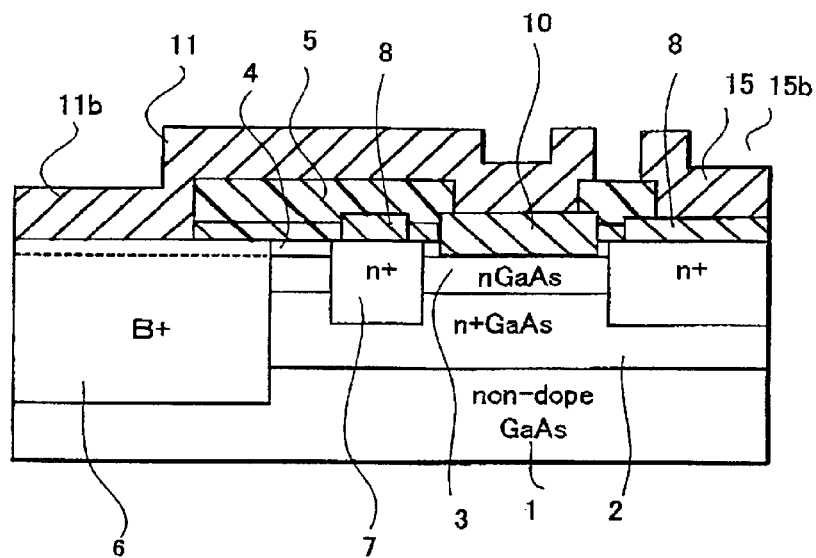
FIG. 5 is a first modification of the device of the first embodiment.

FIG. 5 is a cross-sectional view of a Schottky barrier diode device of a first modification of the first embodiment of this invention. The configuration of this modified embodiment is the same as the configuration of the first embodiment except two features. First, the device of the first modification has a stabilized layer 4 on top of the n epitaxial layer 3. The stabilized layer 4 is made of an undoped InGaP and has a thickness of about 20 nm. The stabilized layer 4 protects the surface of the n epitaxial layer 3 from external contamination so that a Schottky contact with excellent high frequency characteristics is formed. For this reason, the portion of the stabilized layer 4 corresponding to the Schottky contact region 11a is removed immediately before the formation of the Schottky contact. Second, in this modification, a Schottky electrode 10 is first formed on the n epitaxial layer 3 as a separate element different from the anode electrode 11. The Schottky contact region 11a is formed underneath the Schottky electrode 10. The anode electrode 11 simply provides wiring between the Schottky electrode 10 and the anode bonding pad 11b. The Schottky electrode 10 is also made of the Ti/Pt/Au metal layer. The impurity-implanted region 7 and the insulating region 6 are formed by injecting corresponding impurities into the corresponding regions through the stabilized layer 4.

Figure 6:
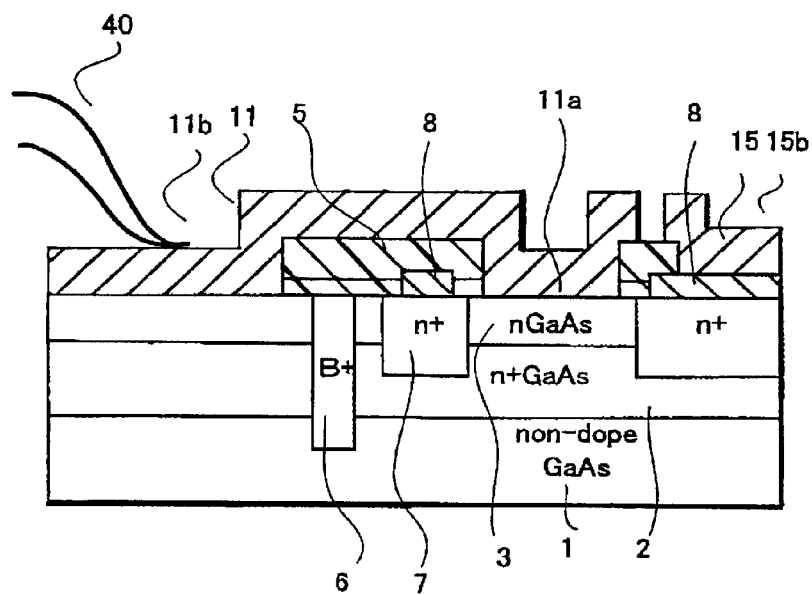
FIG. 6 is a second modification of the device of the first embodiment.

FIG. 6 is a cross-sectional view of a Schottky barrier diode device of a second modification of the first embodiment of this invention. The configuration of the second modification is the same as the configuration of the first embodiment except that the insulating region 6 is disposed around the anode bonding pad 11b rather than underneath the anode bonding pad 11b. In this modification, the insulating region 6 surrounds portions of the n epitaxial layer 3 and the n+ epitaxial layer 2 under the anode bonding pad 11b so that the surrounded portions are electrically insulated from other portions of the epitaxial layers 2, 3. As in the case of the first embodiment, the insulating region 6 reaches the insulating substrate 1. Although high frequency signals applied to the anode bonding pad 11b carry to the epitaxial layers 2, 3 underneath the anode bonding pad 11b, the signals cannot advance beyond the insulating region 6.

Figure 7A:
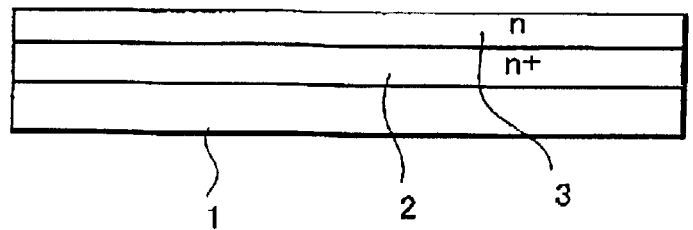
FIGS. 7A–7E show processing steps of a manufacturing method of the Schottky barrier diode of the first embodiment.

FIGS. 7A–7E show process steps of a manufacturing method of the Schottky barrier diode of the first embodiment. First, a device intermediate shown in FIG. 7A is prepared. An n+ epitaxial layer 2 is formed on an undoped GaAs substrate 1 by a MOCVD process. The n+ epitaxial layer 2 has a thickness of about 500 nm and a silicon impurity concentration of about $5 \times 10^{18}$ cm$^{-3}$. An n epitaxial layer 3 having a thickness of about 250 nm and a silicon impurity concentration of about $1.3 \times 10^{17}$ cm$^{-3}$ is formed on the n+ epitaxial layer 2.

Figure 7B:
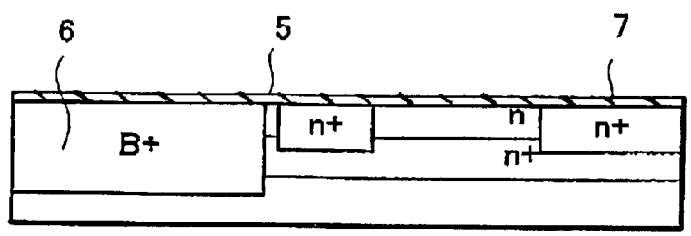

In the next step shown in FIG. 7B, a nitride film 5 is, first, formed on the entire top surface of the device intermediate. A resist layer is, then, formed on the nitride film 5 and is patterned to open a window for impurity injection to an insulating region 6 by a photolithographic process. Boron ions are injected through the window created in the resist film to form the insulating region 6 having a boron concentration of about $3 \times 10^{17}$ cm$^{-3}$, which reaches the undoped GaAs substrate 1. For creating the insulating region 6 of the second modification of the first embodiment, which surrounds the anode bonding pad 11b, the resist layer is patterned accordingly.

Then, another resist layer is formed after removal of the first resist layer, and is patterned to open a window for impurity injection to an impurity-implanted region 7 by the photolithographic process. Silicon impurities are injected through the window to form the impurity-implanted region 7 having a silicon concentration of about $1.0 \times 10^{18}$ cm$^{-3}$. The impurity-implanted region 7 penetrates the n epitaxial layer 3 and reaches the n+ epitaxial layer 2. It is better to inject the silicon impurities in a manner to assure an equal distribution of the impurities along the depth of the impurity-implanted region 7. One such method is to inject a predetermined dose of the impurities in a plurality of separate injection steps, each of which may have a different injection condition. After removal of the second resist layer, another nitride film 5 is formed on the device intermediate for anneal protection, and the device intermediate is annealed to activate the impurity-implanted region 7 and the insulating region 6.

Figure 7C:
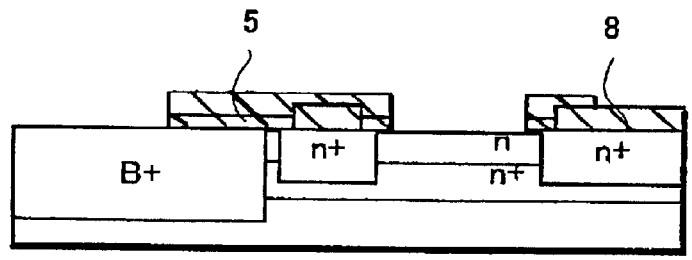

The process step following the step of FIG. 7B is shown in FIG. 7C. A new resist layer is formed on the entire top surface of the device intermediate, and is patterned to open a window at a portion corresponding to a ohmic electrode formation by the photolithographic process. The nitride film 5 exposed in the window is removed to expose the top surface of the impurity-implanted region 7. A AuGe film, a Ni film and a Au film are vacuum evaporated on the exposed impurity-implanted region 7 in this order. After a removal of the resist film with the lift-off process, the device intermediate undergoes a heat treatment so that the deposited metal films turn into an ohmic electrode 8 making a ohmic contact with the impurity-implanted region 7.

An additional nitride film 5 having a thickness of about 500 nm is formed on the entire top surface of the device intermediate. A resist layer is, then, formed on the nitride film 5, and is patterned to open windows at portions corresponding to a Schottky contact region 11a, an anode bonding pad 11b, a cathode electrode 15 and the cathode bonding pad 15b. The nitride film 5 exposed in the windows is removed by a dry etching process using the resist layer as a mask, which is also removed after the etching process. After this step, a Schottky electrode 10 may be formed after the second formation of the nitride film 5.

Figure 7D:
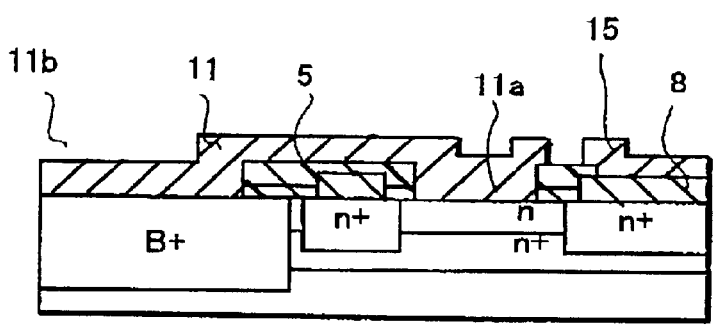

In the next step shown in FIG. 7D, a resist layer is formed on the nitride film 5, and is patterned to open windows at portions corresponding to an anode electrode 14 as well as the Schottky contact region 11a, the cathode electrode 15, the anode bonding pad 11b and the cathode bonding pad 15b. Using the resist layer as a mask, a metal wiring pattern is formed on the top surface of the device intermediate. This second wiring layer is formed by successively vacuum depositing a Ti film, a Pt film and a Au film in this order. Accordingly, the Ti/Pt/Au metal layer directly contacts the n epitaxial layer 3 to form the Schottky contact region 11a, and also directly contacts the ohmic electrode 8 on its cathode side. The anode bonding pad 11b, which is formed directly on the insulating layer 3, and the anode electrode 11, which provides wiring between the Schottky contact region 11a and the anode bonding pad 11b, are a part of the second wiring layer. The cathode electrode 15, which is formed directly on the impurity-implanted region 7, and the cathode bonding pad 15b are also formed as a part of the second wiring layer. The portion of the ohmic electrode 8 under the anode electrode 11 is insulated from the Ti/Pt/Au metal layer by the nitride film 5 remaining on the top surface of the n epitaxial layer 3. The resist layer is removed by the lift-off process and a backside rapping is performed on the device intermediate.

Figure 1:
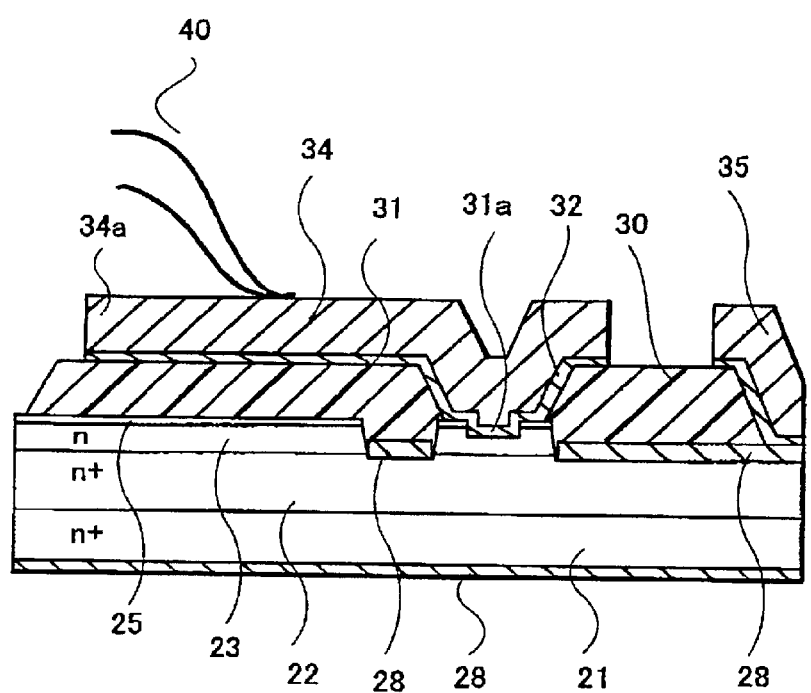
FIG. 1 is a cross-sectional view of a conventional Schottky barrier diode having a polyimide layer.
Figure 2:
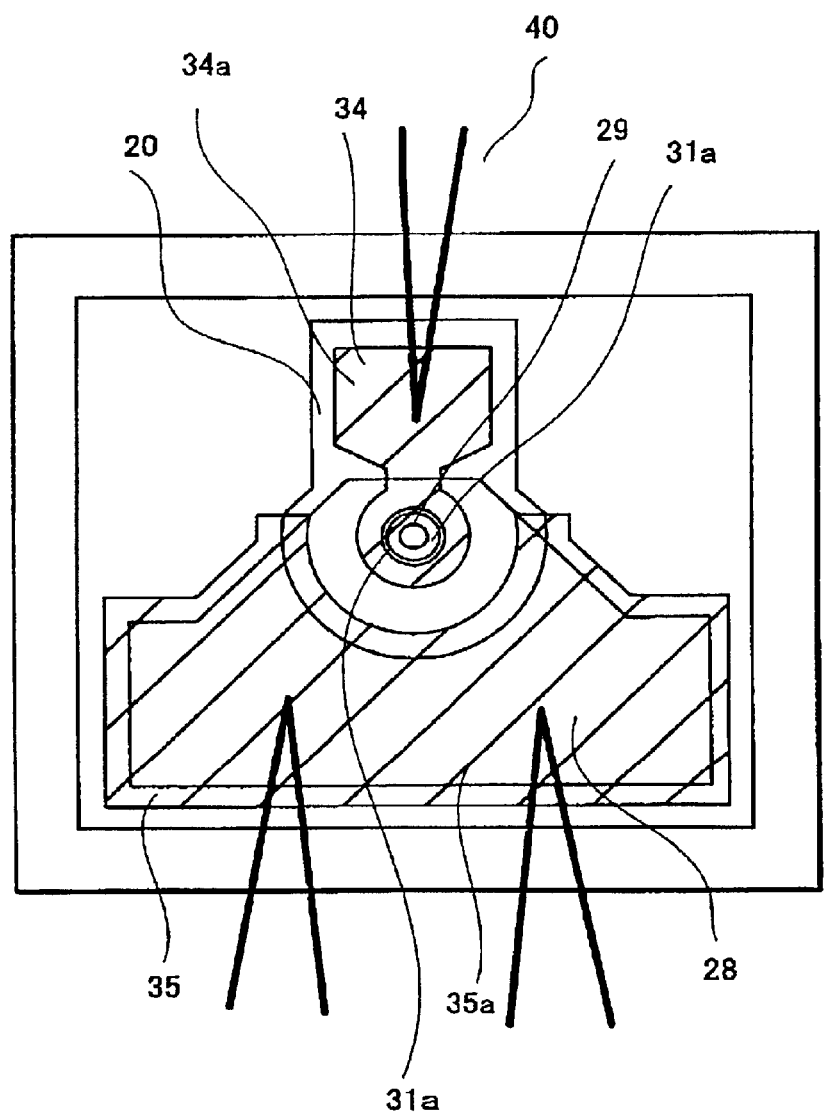
FIG. 2 is a schematic top view of the conventional device of FIG. 1.

Because of this planar configuration of this embodiment, there is no need for forming a polyimide layer and a plated layer on top of the polyimide layer, as in the case of a manufacturing method of the conventional device of FIG. 1. Accordingly, the manufacturing method of the device of the first embodiment is much simpler and easier to control than the conventional method.

Figure 7E:
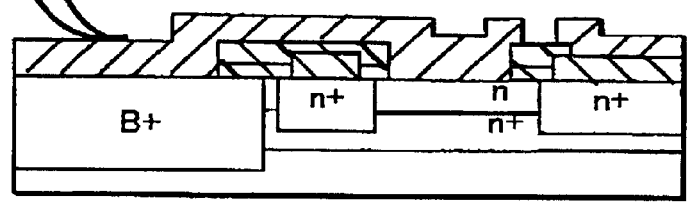

In the next step shown in FIG. 7E, the Schottky barrier diode is assembled as individual devices. First, the compound semiconductor substrate 1 having individual diode elements thereon is diced and separated into individual chips. The individual chips are, then, mounted on frames (not shown in the figure) and undergo a wire bonding process to connect the bonding pads 11b, 15b and corresponding leads of the frame. In this embodiment, gold wires are bonded to the bonding pads 11b, 15b using a well known stitch bonding process. Finally, the individual chips are molded by a transfer molding process.

A stitch bonding process fixes two bonding wires in one bonding procedure and requires a smaller bonding area than a ball bonding process. In the manufacturing method of the conventional Schottky barrier diode of FIG. 1, however, use of a stitch bonding process results in large amount of defects including pealing and crack formation of the anode electrode during the bonding process due to the presence of the polyimide layer. The planar configuration without the polyimide layer of the diode device of this embodiment significantly reduces such defects.

Figure 8:
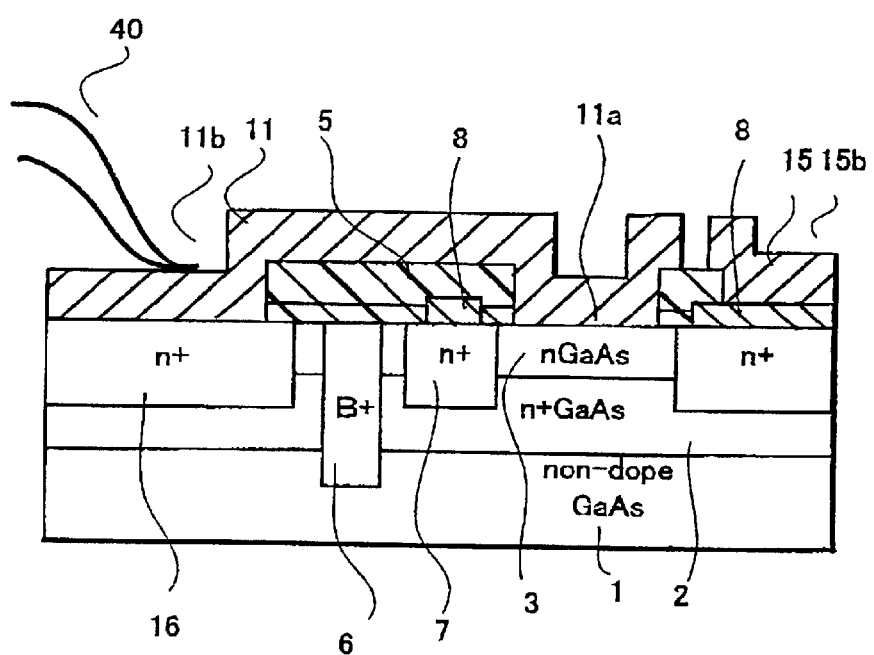
FIG. 8 is a cross-sectional view of a Schottky barrier diode of a second embodiment of this invention.
Figure 9:
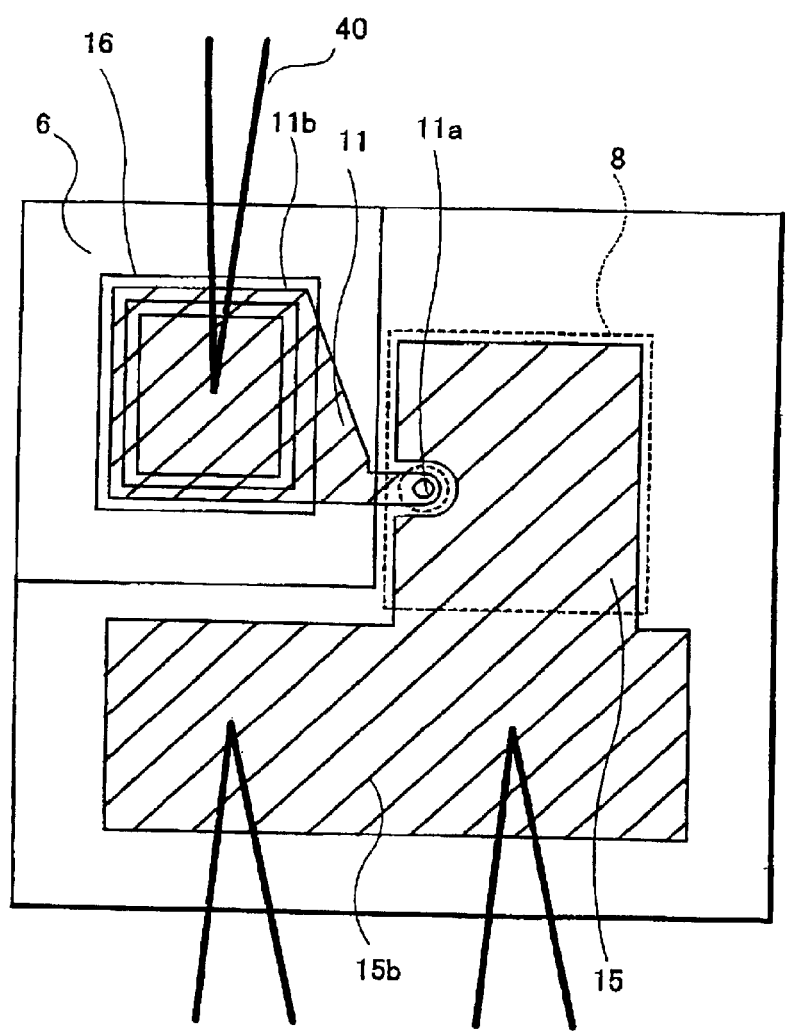
FIG. 9 is a schematic top view of the device of the second embodiment.

FIG. 8 is a cross-sectional view of a Schottky barrier diode of a second embodiment of this invention. FIG. 9 is a top view of the diode device of the second embodiment. This diode device has the same configuration as the diode device of the second modification of the first embodiment shown in FIG. 6 except that an additional impurity-implanted region 16 is formed underneath the anode bonding pad 11b.

The additional impurity-implanted region 16 underneath the anode bonding pad 11b is an n+ impurity region ($^{29}$Si$^+$, $1 \times 10^{18}$ cm$^{-3}$), which is formed simultaneously as the impurity-implanted region 7 underneath the ohmic electrode 8. The size of the additional impurity-implanted region 16 is larger than the size of the anode bonding pad 11b, as shown in FIG. 9. The insulating region 6, which is formed by injecting boron impurities, surrounds the additional impurity-implanted region 16, as shown in FIG. 9. As in the case of the first embodiment, the insulating region 6 reaches the insulating substrate 1.

In the configuration of FIG. 6, a depletion layer may be formed in the insulating region 6, and extend toward the ohmic electrode 8 when high frequency signals are applied to the anode bonding pad 11b. Depending on the high frequency signals the anode bonding pad 11b receives, the depletion layer may eventually reach the ohmic electrode 8, resulting in significant signal leakage. In the configuration of this embodiment, however, the additional impurity-implanted region 16, which covers a slightly larger area than the anode bonding pad 11a, prevents the extension of the depletion layer. Although the ohmic electrode 8 is electrically insulated from the anode bonding bad 11b by the insulating region 6, the presence of the additional impurity-implanted region 16 further reduces high frequency signal leakage.

Figure 10:
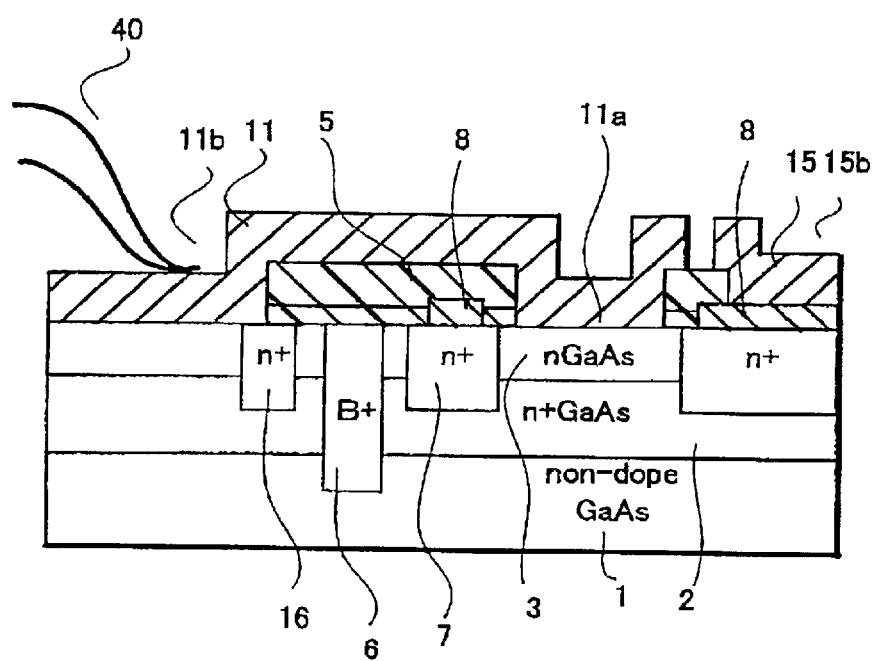
FIG. 10 is a first modification of the device of the second embodiment.

FIG. 10 is a cross-sectional view of a Schottky barrier diode of a first modification of the second embodiment of this invention. This diode device has the same configuration as the diode device of the second embodiment except that the additional impurity-implanted region 16 is formed only in the peripheral portion of the anode bonding pad 11b. As long as the edges of the anode bonding pad 11b are covered by the additional impurity-implanted region 16, the portions of the epitaxial layers 2, 3 under the anode bonding pad 11b is effectively insulated from other portions of the epitaxial layers 2, 3. For this configuration to be effective, the additional impurity-implanted region 16 should extend outside the anode bonding pad 11b.

Figure 11A:
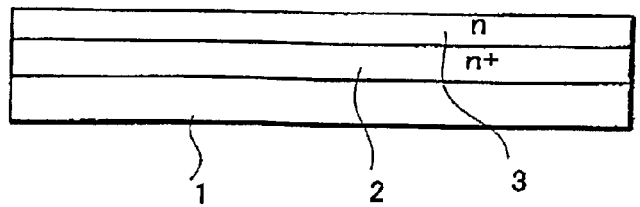
FIGS. 11A–11E show processing steps of a manufacturing method of the Schottky barrier diode of the second embodiment.

FIGS. 11A–11E show process steps of a manufacturing method of the Schottky barrier diode of the second embodiment. A device intermediate shown in FIG. 11A is prepared in the same manner as the first step of the manufacturing method of the first embodiment shown in FIG. 7A. First, an n+ epitaxial layer 2 is formed on an undoped GaAs substrate 1 by a MOCVD process. The n+ epitaxial layer 2 has a thickness of about 500 nm and a silicon impurity concentration of about $5 \times 10^{18}$ cm$^{-3}$. An n epitaxial layer 3 having a thickness of about 250 nm and a silicon impurity concentration of about $1.3 \times 10^{17}$ cm$^{-3}$ is formed on the n+ epitaxial layer 2.

Figure 11B:
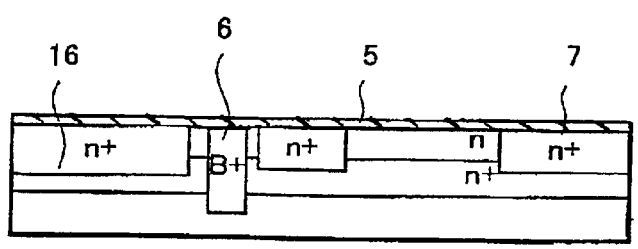

In the next step shown in FIG. 11B, a nitride film 5 is, first, formed on the entire top surface of the device intermediate. A resist layer is, then, formed on the nitride film 5 and is patterned to open a window for impurity injection to an insulating region 6 by the photolithographic process. Boron ions are injected through the window created in the resist film to form the insulating region 6 having a boron concentration of about $3 \times 10^{17}$ cm$^{-3}$, which reaches the undoped GaAs substrate 1. In this embodiment, the insulating region 6 is disposed around the additional impurity-implanted region 16.

Then, another resist layer is formed after removal of the first resist layer, and is patterned to open windows for impurity injection to the impurity-implanted region 7 and the additional impurity-implanted region 16 by the photolithographic process. Silicon impurities are injected through the window to form the impurity-implanted regions 7, 16 having a silicon concentration of about $1.0 \times 10^{18}$ cm$^{-3}$. The impurity-implanted regions 7, 16 penetrate the n epitaxial layer 3 and reaches the n+ epitaxial layer 2. It is better to inject the silicon impurities in a manner to assure an equal distribution of the impurities along the depth of the impurity-implanted regions 7, 16. One such method is to inject a predetermined dose of the impurities in a plurality of separate injection steps, each of which may have a different injection condition. After removal of the second resist layer, another nitride film 5 is formed on the device intermediate for anneal protection, and the device intermediate is annealed to activate the impurity-implanted regions 7, 16 and the insulating region 6. In this embodiment, the additional impurity-implanted region 16 is formed so that the anode bonding pad 11b is within the additional impurity-implanted region 16 when the pad is formed. As a modification, the resist layer may be patterned to form the additional impurity-implanted region 16 covering only the peripheral portion of the anode bonding pas 11b. Either way, the formation of the additional impurity-implanted region 16 does not require any additional processing step because it is formed simultaneously with the impurity-implanted region 7.

Figure 11C:
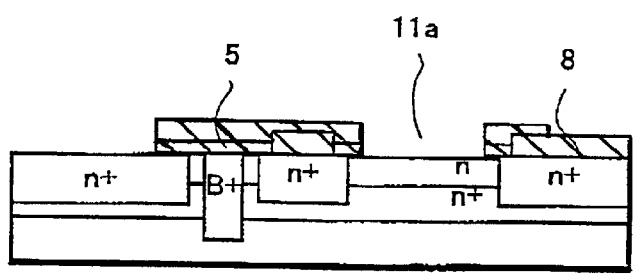
Figure 11D:
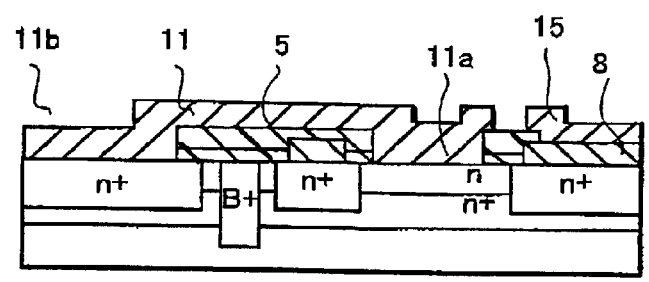
Figure 11E:
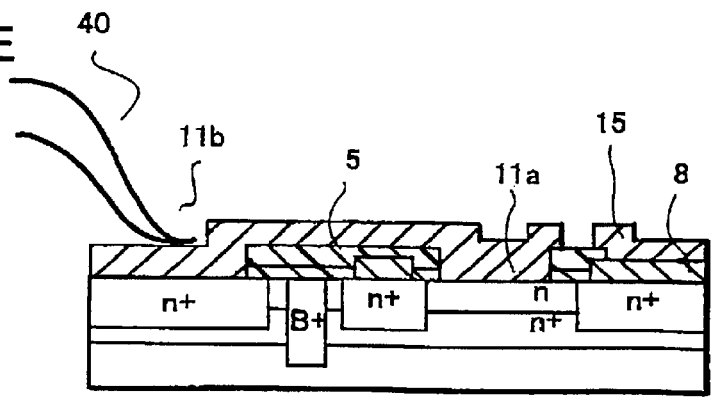

The subsequent processing steps shown in FIGS. 11C–11E are essentially the same as the corresponding steps of the manufacturing method of the first embodiment shown in FIGS. 7C–7E, although the insulating region 6 occupies a location different from the first embodiment and the additional impurity-implanted region 16 occupies the location of the insulating region 6 of the first embodiment.

The above is a detailed description of a particular embodiments of the invention which are not intended to limit the invention to the embodiments described. It is recognized that modifications within the scope of the invention will occur to a person skilled in the art. Such modifications and equivalents of the invention are intended for inclusion within the scope of this invention.

What is claimed is:

1. A manufacturing method of Schottky barrier diode comprising:

providing a substrate made of a compound semiconductor;

epitaxially growing a first layer of a conduction type on the substrate;

forming an insulating region at a predetermined portion of the first layer so that the insulating region reaches the substrate; and forming a metal layer to make a Schottky contact with the first layer and to provide an anode bonding pad.

2. The manufacturing method of Schottky barrier diode of claim 1, wherein the anode bonding pad is formed on the insulating region.

3. The manufacturing method of Schottky barrier diode of claim 1, wherein the insulating region is formed to surround the anode bonding pad.

4. The manufacturing method of Schottky barrier diode of claim 1, further comprising, forming an ohmic electrode disposed adjacent the Schottky contact, and forming an insulating film on the ohmic electrode before the forming of metal layer.

5. The manufacturing method of Schottky barrier diode of claim 1, wherein the substrate comprises an undoped GaAs substrate.

6. The manufacturing method of Schottky barrier diode of claim 1, further comprising connecting a bonding wire to the anode bonding pad.

7. The manufacturing method of Schottky barrier diode of claim 1, further comprising epitaxially growing a second layer of the conduction type on the substrate before epitaxially growing the first layer, the second layer having a higher impurity concentration than the first layer.

8. The manufacturing method of Schottky barrier diode of claim 1, wherein the forming of the insulating region comprises implanting impurity ions into the predetermined portion of the first layer.

9. The manufacturing method of Schottky barrier diode of claim 1, wherein the forming of the metal layer comprises depositing a Ti film, depositing a Pt film on the Ti film and depositing a Au film on the Pt film.

10. A manufacturing method of Schottky barrier diode comprising:

provinding a substrate made of a compound semiconductor;

epitaxially growing a first layer of a conduction type on the substrate;

forming an impurity-implanted region of the conduction type at a predetermined portion of the first layer;

forming an insulating region around the impurity-implanted region so that the insulating region reaches the substrate; and forming a metal layer to make a Schottky contact with the first layer and to provide an anode bonding pad.

11. The manufacturing method of Schottky barrier diode of claim 10, wherein the anode bonding pad is formed on the impurity-implanted region.

12. The manufacturing method of Schottky barrier diode of claim 10, wherein the impurity-implanted region is formed underneath a peripheral portion of the anode bonding pad.

13. The manufacturing method of Schottky barrier diode of claim 10, further comprising, forming an ohmic electrode disposed adjacent the Schottky contact, and forming an insulating film on the ohmic electrode before the forming of metal layer.

14. The manufacturing method of Schottky barrier diode of claim 10, wherein the substrate comprises an undoped GaAs substrate.

15. The manufacturing method of Schottky barrier diode of claim 10, further comprising connecting a bonding wire to the anode bonding pad.

16. The manufacturing method of Schottky barrier diode of claim 10, further comprising epitaxially growing a second layer of the conduction type on the substrate before epitaxially growing the first layer, the second layer having a higher impurity concentration than the first layer.

17. The manufacturing method of Schottky barrier diode of claim 10, wherein the forming of the insulating region comprises implanting impurity ions into the first layer.

18. The manufacturing method of Schottky barrier diode of claim 10, wherein the forming of the metal layer comprises depositing a Ti film, depositing a Pt film on the Ti film and depositing a Au film on the Pt film.

* * * * *